(12) United States Patent
Hunt et al.

(10) Patent No.: US 6,836,014 B2
(45) Date of Patent: Dec. 28, 2004

(54) OPTICAL TESTING OF INTEGRATED CIRCUITS WITH TEMPERATURE CONTROL

(75) Inventors: Dean M. Hunt, Danville, CA (US); Don Haga, Redwood City, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/264,716

(22) Filed: Oct. 3, 2002

(65) Prior Publication Data
US 2004/0065880 A1 Apr. 8, 2004
(Under 37 CFR 1.47)

(51) Int. Cl.[7] ............................. H01L 23/06; H05K 7/20
(52) U.S. Cl. ....................... 257/706; 257/705; 257/707; 257/712; 257/717; 361/704; 361/705; 361/706
(58) Field of Search ................................. 257/705–707, 257/712, 717–720; 361/676, 709, 704–705

(56) References Cited

U.S. PATENT DOCUMENTS

| | | | |
|---|---|---|---|
| 5,872,360 A | | 2/1999 | Paniccia et al. .......... 250/341.4 |
| 5,895,972 A | * | 4/1999 | Paniccia ...................... 257/706 |
| 5,923,086 A | | 7/1999 | Winer et al. ................. 257/713 |
| 6,424,533 B1 | * | 7/2002 | Chu et al. .................... 361/719 |
| 6,476,627 B1 | * | 11/2002 | Pelissier et al. ............ 324/760 |

* cited by examiner

Primary Examiner—Donghee Kang
(74) Attorney, Agent, or Firm—Dorsey & Whitney LLP

(57) ABSTRACT

Method and apparatus for optically testing (e.g., using a laser beam) an operating integrated circuit (device under test—DUT) that actively control the operating temperature of the DUT. This is chiefly useful with flip-chip packaged ICs. The temperature of the DUT varies with its operating power consumption, and this fluctuation in temperature adversely affects the results obtained during optical probing or other optical testing. Furthermore, the DUT may be damaged if its temperature exceeds design limits. The temperature of the DUT is controlled by thermally contacting the exposed backside surface of the DUT die to a diamond film heat conductor, an associated heat sink structure, and at least one thermoelectric device. The thermoelectric device is controlled by a temperature sensor proximal to the DUT. By controlling the amount and direction of the electrical current supplied to the thermoelectric device in response to the sensed temperature, the temperature of the DUT is maintained.

15 Claims, 4 Drawing Sheets

OPTICAL TESTING OF INTEGRATED CIRCUITS WITH TEMPERATURE CONTROL

FIELD OF THE INVENTION

The present invention relates to testing, and more specifically, to optical probing of integrated circuits.

BACKGROUND

Many advancements have been made in the use of optical probing techniques used for testing integrated circuits; see, e.g., Paniccia, U.S. Pat. No. 5,895,972, Apr. 20, 1999 ("Paniccia"), incorporated by reference herein in its entirety. As described in Paniccia, flip-chips (integrated circuits which are mounted face down in the package) can be optically tested using laser probing. This is because the backside surface of the die of the integrated circuit ("IC") device under test ("DUT"), generally having a silicon substrate, is accessible for the purposes of laser or optical probing and/or for detecting photon emissions emitted from an active DUT. (This of course requires that the package be opened up.) Thus optical probing involves detecting optically electrical activity in the DUT while it is operating.

Although such optical probing is not limited to flip-chips, the backside of the die of the DUT must be visible to the optical probe so that waveform measurements can be made. During the testing or debugging of a DUT, it is generally desirable to operate the DUT at its full operating capacity and speed. Since the electric power consumption in, e.g., a microprocessor, is typically high, it is known in the art to exhaust heat created by the operation of the DUT to maintain an acceptable operating temperature; otherwise the DUT may be damaged.

FIG. 1A illustrates in a side view the approach of Paniccia (taken from his FIG. 5A) to dissipating heat from a flip-chip mounted integrated circuit die DUT 102. DUT 102 is conventionally mounted, via a plurality of ball bonds designated collectively as 107, to its package 110 having pins designated collectively as 115 used for coupling signals to/from and power to DUT 102. Pins 115 are electronically connected to contacts on a conventional test head 101 that also mechanically supports DUT 102 and the associated heat dissipating structures. Test head 101 also supplies the signals to and receives signals from the pins 115 and supplies power thereto. An infrared transmissive heat conductor film 120 is disposed over the backside surface 105 of DUT 102. A heat sink 150 (i.e., a structure capable of absorbing dissipating heat, being typically of large thermal mass and made of, e.g., copper) is in thermal contact with the outer edges of the heat conductor's top surface. Heat conductor film 120 is of a material that is transmissive of infrared wavelength light, e.g., diamond. (The remainder of the test apparatus is not shown here.) FIG. 1B illustrates a plan view of the FIG. 1A apparatus.

SUMMARY

Although U.S. Pat. No. 5,895,972 describes the removal of heat from an active integrated circuit, we have recognized the additional advantage of actively controlling temperature of the DUT during optical testing. In other words, if during optical probing or other optical testing of the active DUT the electric power consumption and hence heat output of the DUT fluctuates, we have recognized there will be a corresponding fluctuation in the temperature of the DUT. This fluctuation in temperature will adversely affect the test results obtained by interfering with the propagation of the probing beam and/or the detected light. Passive observation of photons emitted from transistors that are switching is also known.

This fluctuation in temperature will also adversely affect the test results due to the fluctuating operating conditions of the IC die. The goal is to collect the data from the die while maintaining the die at a specific temperature, with only small temperature variations.

Therefore, recognizing that the DUT temperature should be kept constant, we determined there is needed a method and an apparatus for controlling the temperature of an integrated circuit DUT during its active operation while simultaneously allowing the DUT to be probed, or otherwise tested in accordance with an optical-based testing technique.

Therefore, we describe here an apparatus and method for optical based testing through or at the backside surface of an active IC semiconductor substrate (die) that permits active temperature control of the DUT.

In one embodiment, the present apparatus is used with a an integrated circuit DUT having an optically transmissive heat conductor in thermal contact with, e.g., the backside surface of the DUT. The optically transmissive heat conductor is in thermal contact with an additional heat conductor structure, which in turn is in thermal contact with a thermoelectric device. The thermoelectric device, capable of heating or cooling, advantageously controls the temperature of the active IC DUT during optical probing and/or testing.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method with temperature control for optically probing and/or testing an active (operating) semiconductor device (DUT) is described here. In the following description, numerous specific details are set forth such as material types, etc., in order to provide a thorough understanding. However, it will be apparent to one of skill in the art that the invention may be practiced without these specific details. In other instances, well known elements and techniques have not been shown in particular detail in order to avoid unnecessarily obscuring the present invention. This discussion is mainly of controlling the temperature of flip-chip semiconductor devices (e.g., ICs) during optical (laser or other) probing and/or testing. It will be recognized, however, that such is for descriptive purposes only and that the present apparatus and methods are applicable to ICs having other types of packaging.

As explained above, optical-based testing and debugging techniques, such as laser based probing and photon emission detection, are particularly useful for evaluating IC parameters and defects through the backside surface of the IC substrate (die). Since the IC substrate is typically of crystalline silicon which has a band gap energy of 1.1 eV, the energy of a photon used to probe the substrate should have an energy that is less than or equal to 1.1 eV (since the substrate will merely be partially transmissive to such photons). Thus for optical probing the photons propagate to and from the active (transistor) regions located on the principal (front-side) region of the substrate.

Figure 1A:
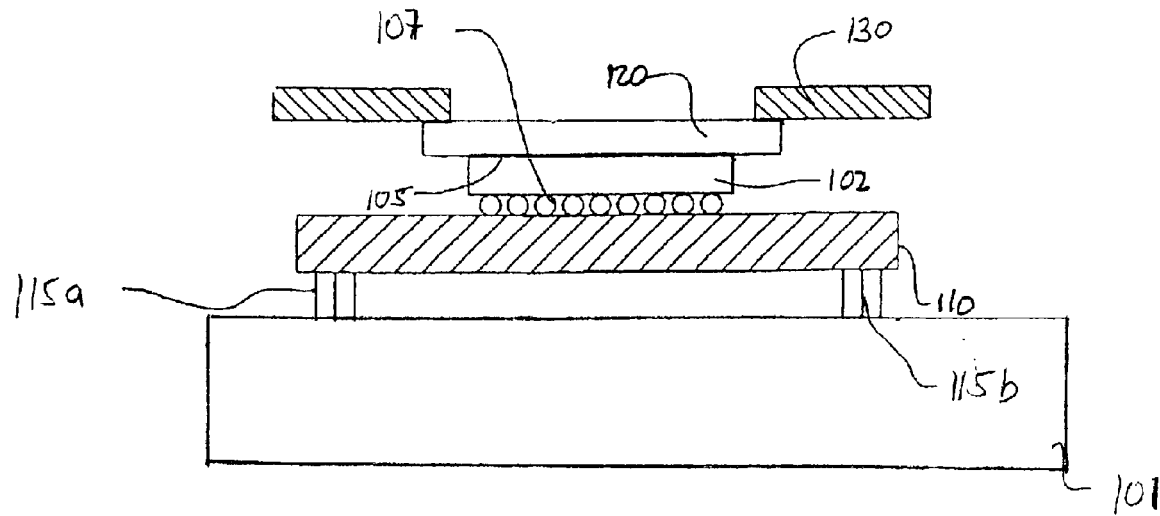
FIG. 1A illustrates a prior art heat removal apparatus.
Figure 1B:
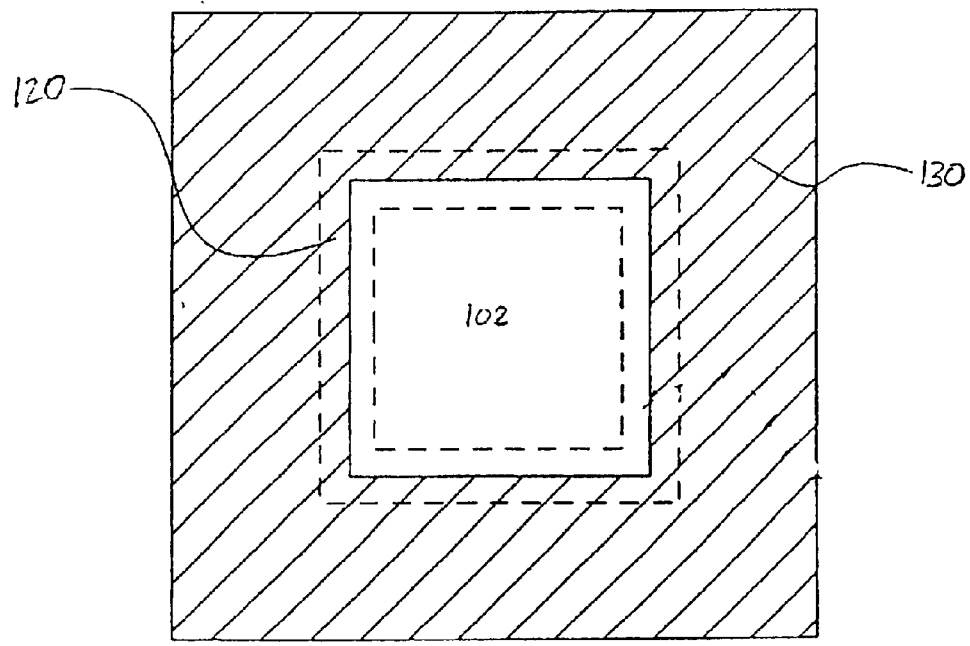
FIG. 1B illustrates a plan view of the FIG. 1A apparatus.
Figure 2:
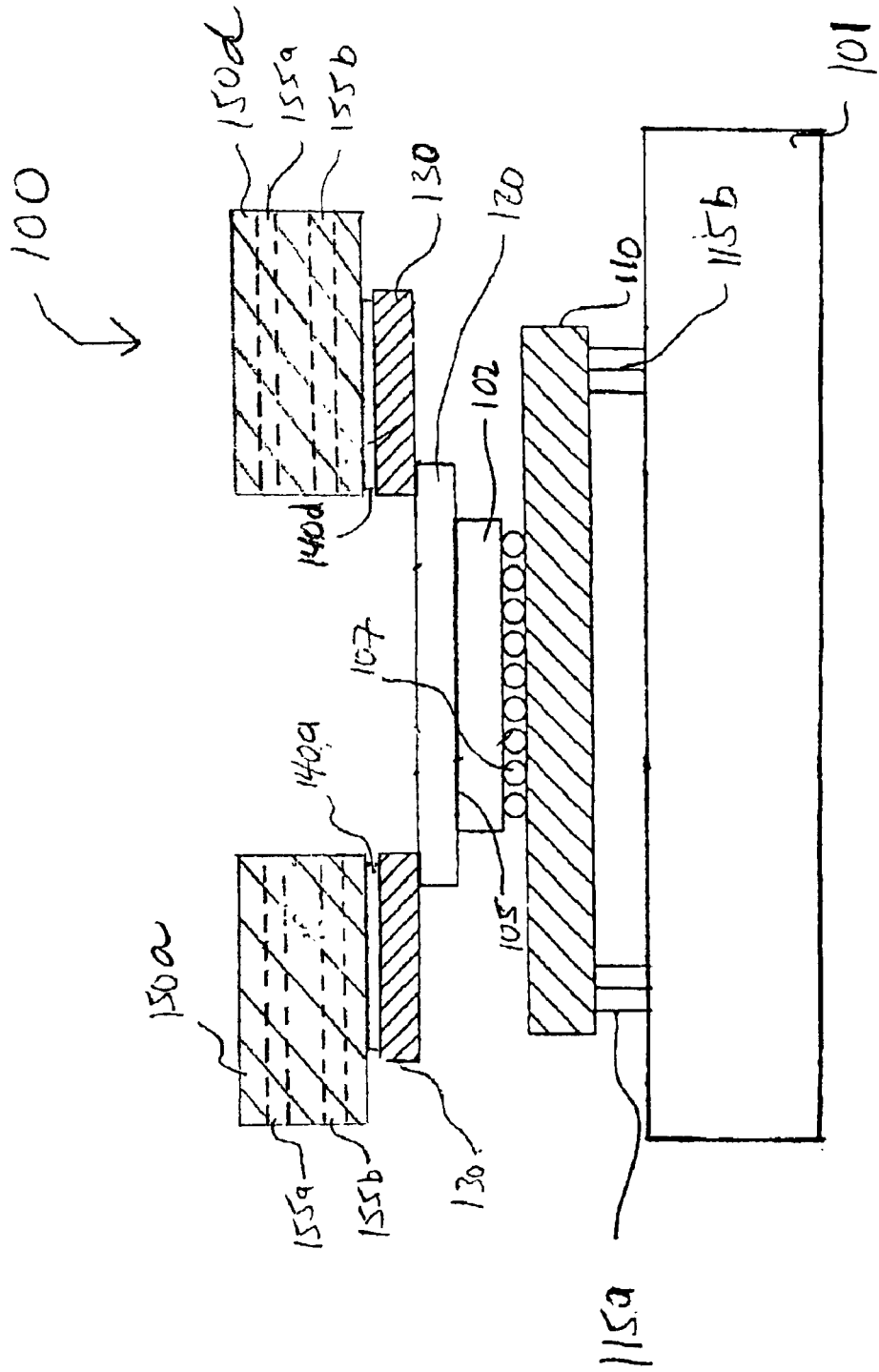
FIG. 2 illustrates a temperature control apparatus in accordance with the present invention.

FIG. 2 illustrates a side view (not to scale) of the present temperature control apparatus 100 in one embodiment. In FIG. 2, a flip-chip mounted integrated circuit die DUT 102 is mounted to its conventional flip-chip IC package 110 and conventionally electrically powered from and receives and transmits signals through its pins 115. The portion of the IC package uppermost in the figure has earlier been cut away to expose the die's backside. Any backside heat sink inside the package is also removed. An, e.g., infrared transmissive heat conductor film 120 is provided in thermal contact with the backside surface of die DUT 102. A heat spreader structure 130 is in thermal contact with the top surface outer edges of the film 120. Thermoelectric devices ("TED") 140a, 140d are in thermal contact with the top surface of the heat sink structure 130. An additional heat sink structure 150a, 150d is in thermal contact with respectively the top surface of each TED 140a, 140d in one embodiment. It is to be understood that the heat spreader and heat sink may be integrated or combined.

Heat conductor film 120 is of a material that is both a conductor of heat and transmissive to, e.g., infrared light. In one embodiment, heat conductor film 120 is made of synthetically grown, optically clear diamond since diamond is both an excellent conductor of heat and is transmissive to infrared light. Since diamond has a thermal conductivity that is approximately twelve times larger than that of silicon, it provides an excellent means for conducting heat away from die DUT 102. The diamond film 120 is placed in intimate contact with the IC, and clamped thereto by the heat spreader 130. The diamond film is a part purchased from Norton Diamond Films or Harris Diamond, and is, e.g., 300 microns thick; its other dimensions depend on those of the underlying DUT die; exemplary dimensions are 22 mm×22 mm. Sufficient pressure is exerted on the die by film 120 to obtain good thermal contact.

In one embodiment heat spreader structure 130 is a machined, oxygen free copper plate concentric around a central window to allow passage of the probe beam. A suitable copper is UNS C14200. An alternative material is, e.g., aluminum. In one embodiment, additional heat sink structures 150a, 150d are provided. Each is an additional machined, oxygen free copper plate having a large thermal mass and a large heat transfer area and defining internal channels 155a, 155b, for carrying coolant (e.g., air or water). Such use of internal coolant channels in a heat sink structure is conventional. Cooling fins may also be provided for heat sink structures 150a, 150d either with or without internal channels 155a, 155b. Heat spreader structure 130 is shaped to allow maximum surface contact with heat conductor film 120, and is a standard part purchased from Melcor. It defines internal cooling channels to carry coolant and is connected to TEDs with screws.

TEDs 140a, 140d are in thermal contact, being clamped with one screw respectively to heat sinks 150a, 150d and heat sink structure 130. Each TED 140a, 140d is of the type that, e.g., operates on the Peltier effect, capable of heating or cooling depending on the voltage bias applied to it. In one embodiment, each TED 140 is a standard part available also from Melcor, of Trenton, N.J.

Figure 3:
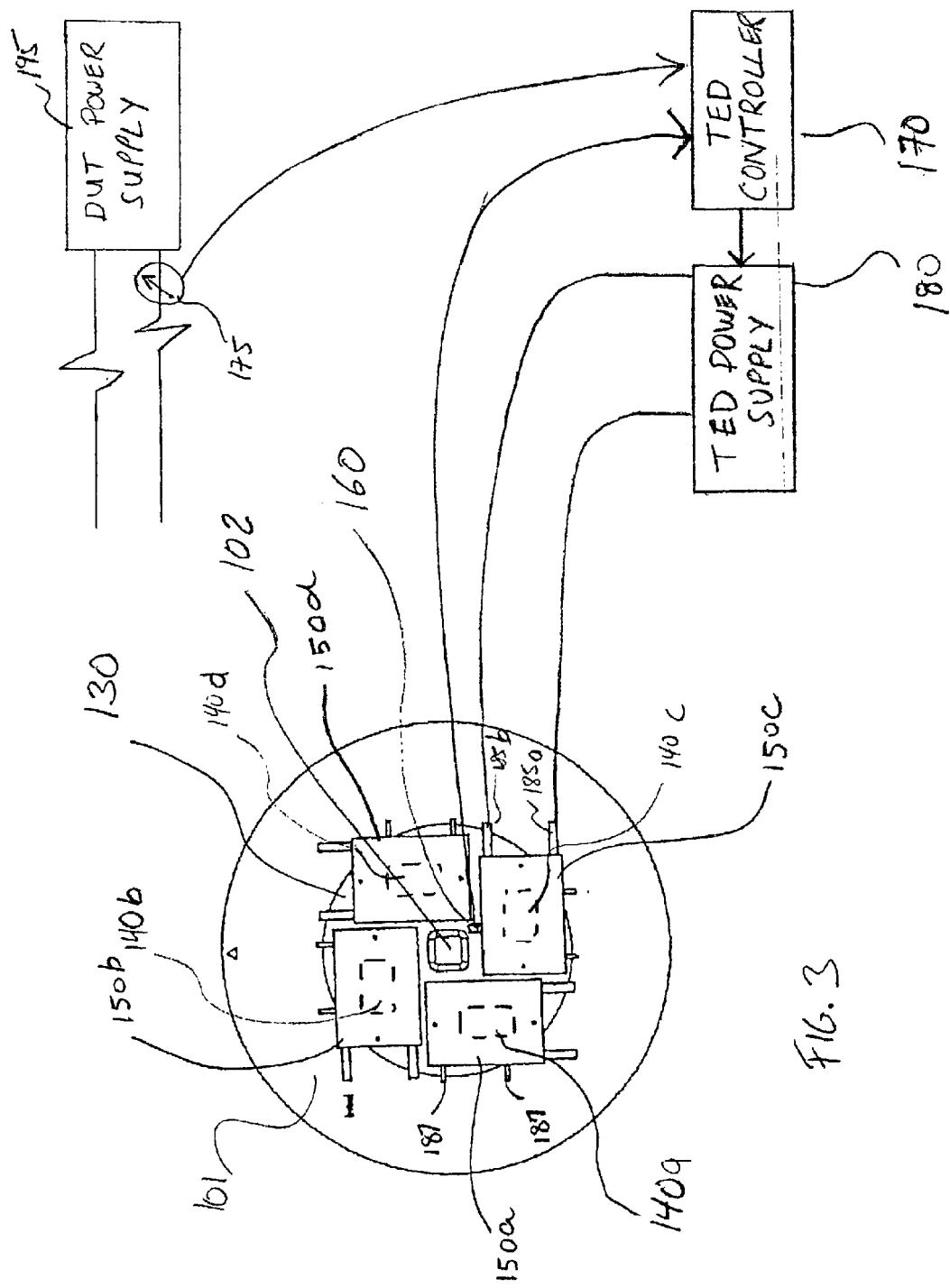
FIG. 3 illustrates a plan view of the apparatus of FIG. 2.

FIG. 3 illustrates a plan view of the temperature control apparatus shown in FIG. 2. In the embodiment shown, four TEDs, TEDs 140a, 140b, 140c, 140d, are in thermal contact with heat sink structure 130 and with respectively associated heat sinks 150a, . . . , 150d, however, this configuration is not limiting. Thus in this embodiment each TED 140 has its associated separate heat sink.

As previously stated, it is advantageous to control the temperature of the active (operating) integrated circuit because we have found that fluctuations in temperature adversely affect the results obtained during the optical testing. While being tested, if DUT 102 is operated at full electric power, TEDs 140 cool DUT 102 to maintain DUT 102 at a predetermined temperature in a range of, e.g., 0° C.–150° C. If electric power to DUT 102 is reduced, the power to the TEDs 140 is adjusted so that DUT 102 is cooled less, again, so that DUT 102 is advantageously maintained at the predetermined temperature. If the power to DUT 102 is reduced to the point where the predetermined temperature is not maintained by the internal exhaust heating of the operating DUT 102, the electrical current bias to TED 140 is reversed to provide heating to the operating DUT 102 by TEDs 140. Each TED, e.g., 140c is powered via leads 185a, 185b by a suitably controlled power supply 180. In one embodiment, the TED power supply 180 is controlled by a standard TED controller 170 from Melcor coupled to a standard temperature sensor 160 from Omega Engineering, Inc. of Stanford, Conn. located on heat sink structure 130 as shown in FIG. 3, connected thereto by epoxy. In an alternate embodiment (not shown), temperature sensor 160 is located on DUT 102 by use of a thermal sensor located on the die so that the signal must be transmitted out of the die through a pin (terminal). Also shown are the coolant connections, e.g., 187, to the heat sinks.

In another embodiment (also shown in FIG. 3), TED power supply 180 is instead controlled using a feedback loop 175 coupling TED power supply controller 170 and the conventional DUT power supply 195 to DUT 102 (the electrical coupling of power supply 195 to DUT 102 is not shown). In this embodiment, rather than controlling TEDs 140 in response to changes in sensed temperature, TEDs 140 are controlled based upon changes in the electric power (e.g., current) drawn by DUT 102. In such an embodiment, if power consumption is high, then TEDs 140 will operate to cool the operating DUT 102. Alternatively, if DUT 102 power draw is low, the electrical current bias of TEDs 140 is reversed to provide heating to DUT 102. The TEDs are coupled in parallel to their power supply 180.

Figure 4:
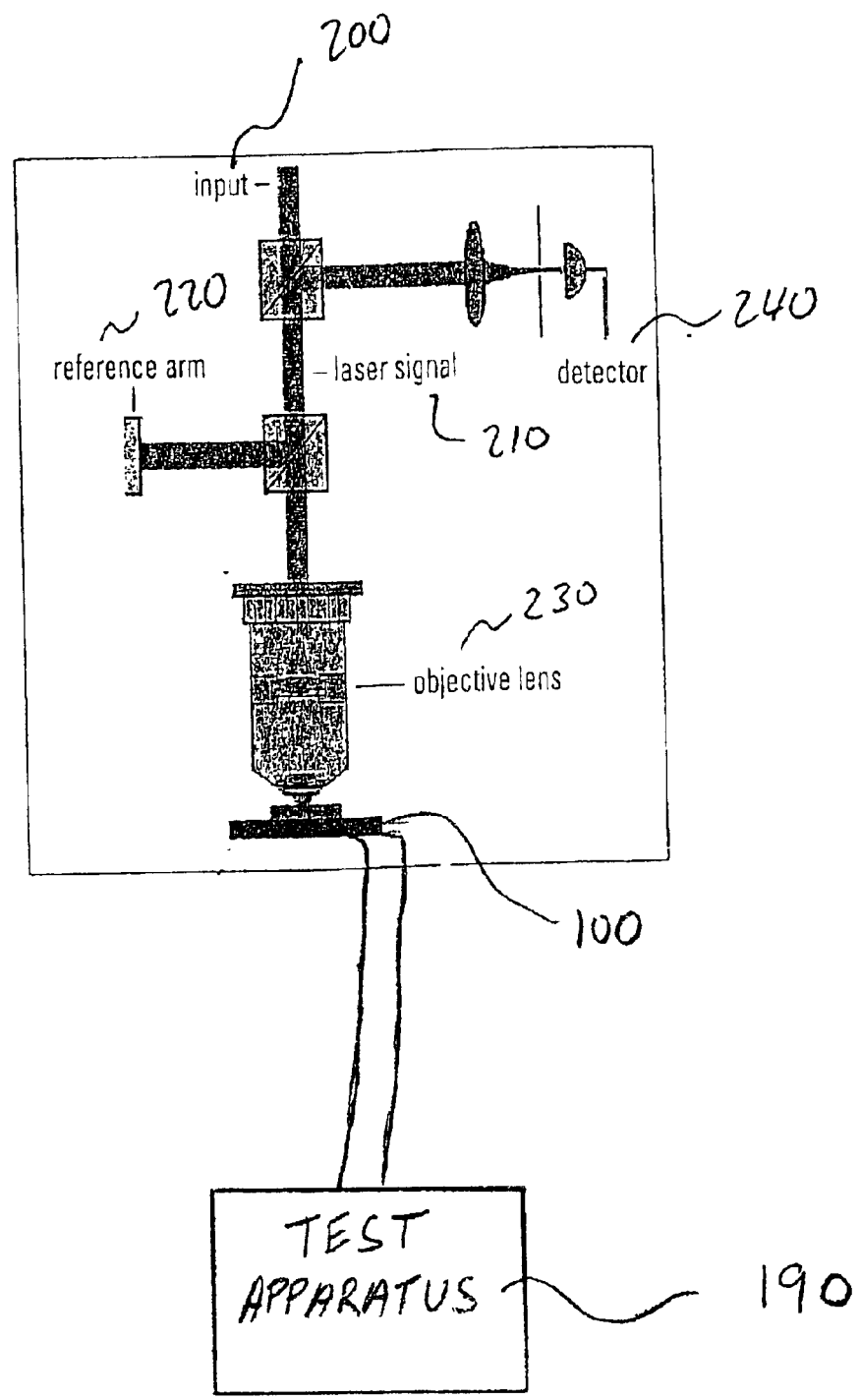
FIG. 4 illustrates an optical probing system using the FIG. 2 apparatus.
Figure 1A:
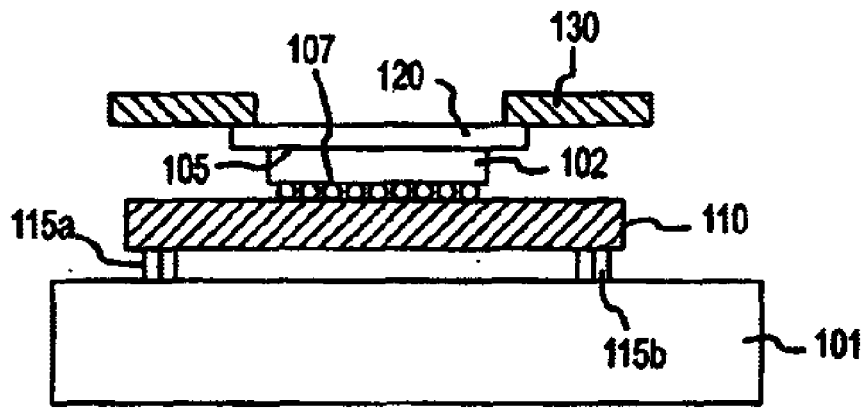
Figure 1B:
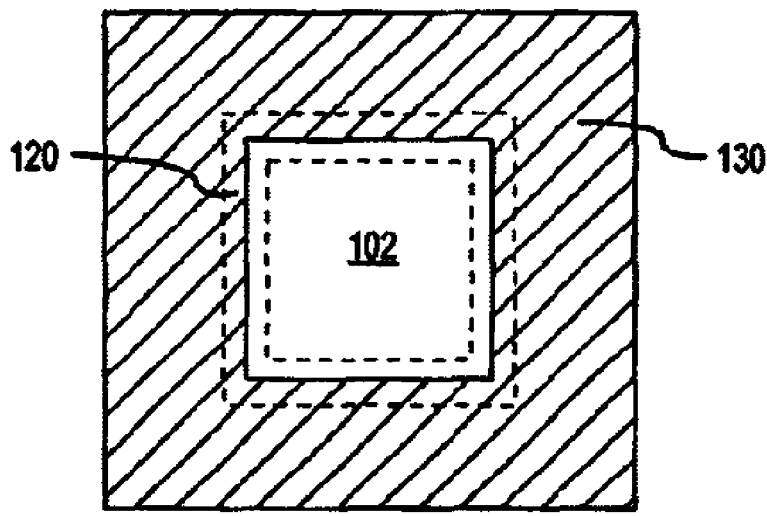
Figure 2:
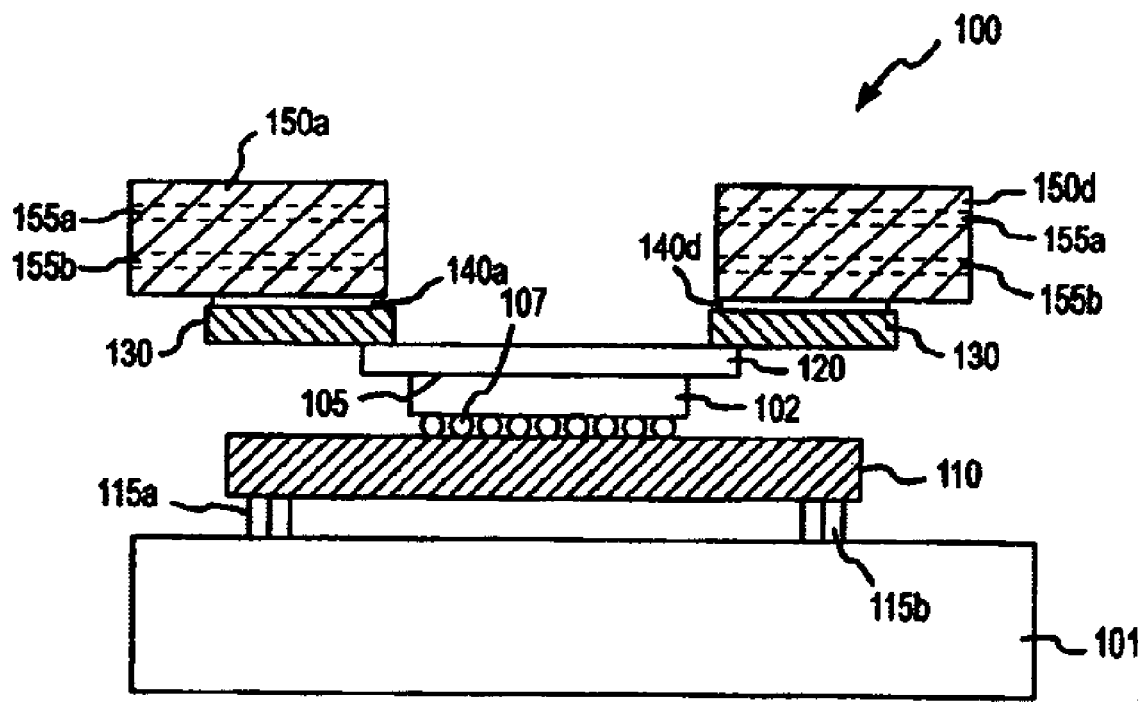
Figure 3:
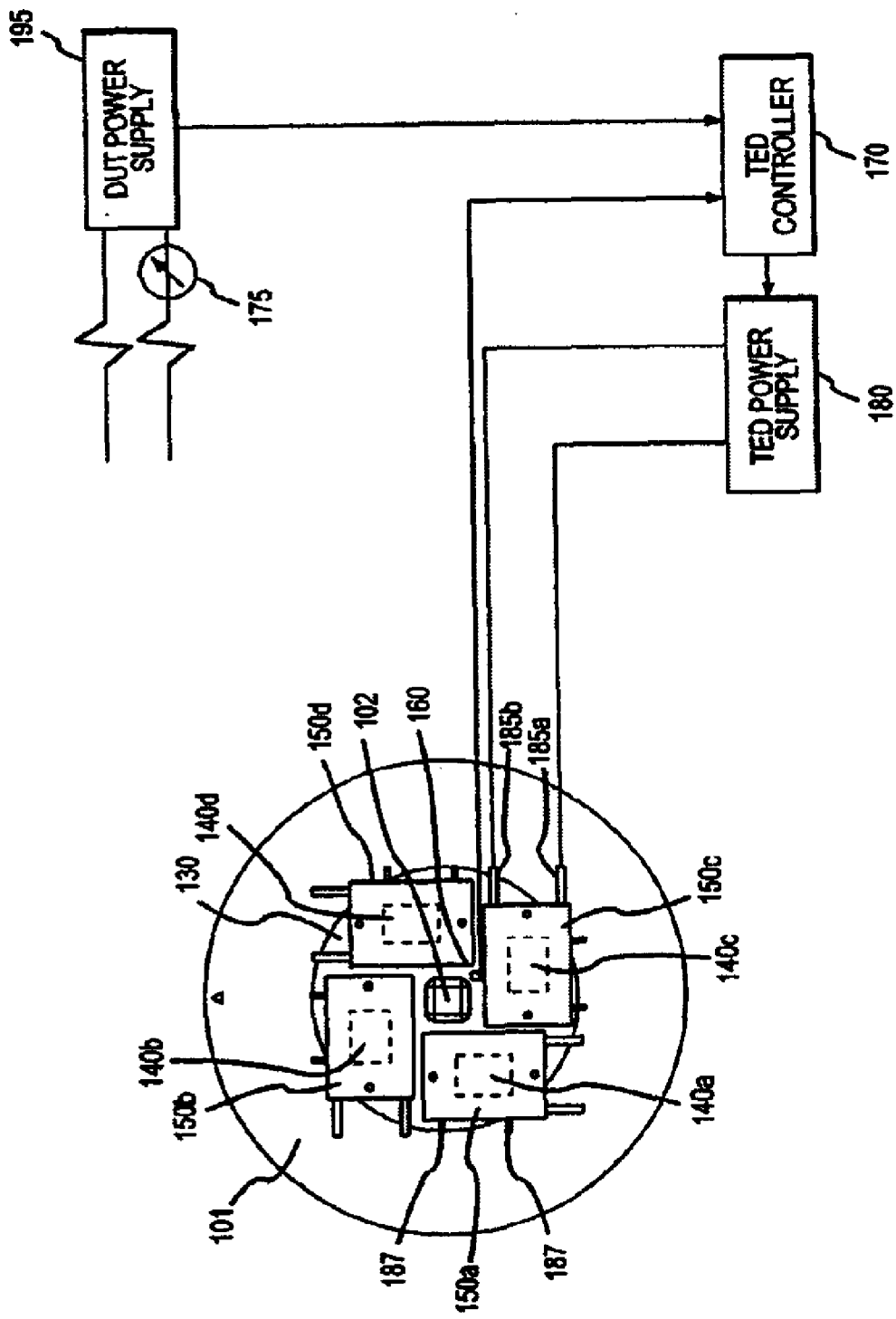
Figure 4:
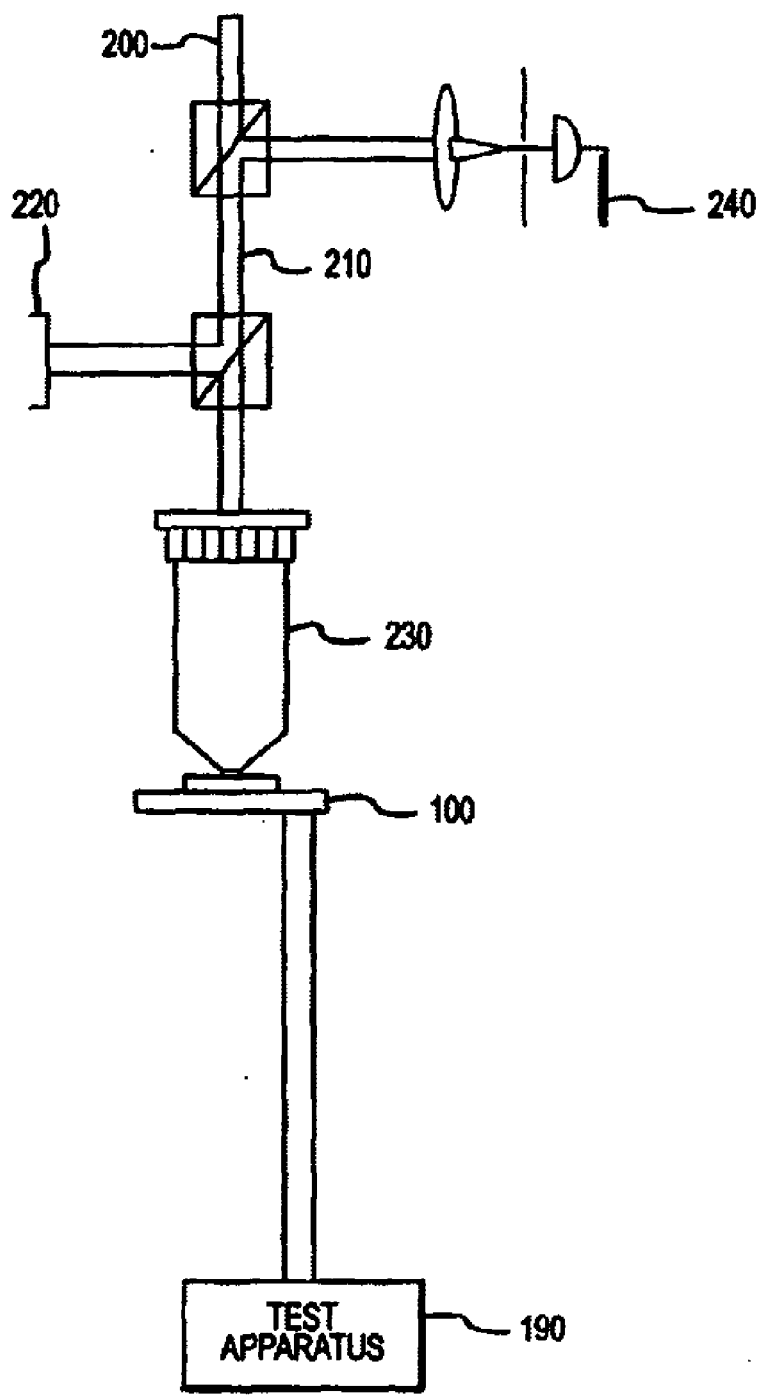

FIG. 4 illustrates in somewhat simplified form one embodiment of the conventional optical probing system (optical probing microscope) used in conjunction with the active DUT temperature control apparatus 100 as described here. DUT 102 is coupled to test apparatus 190. Test apparatus 190 conventionally operates (exercises) the DUT 102 by applying thereto test signal patterns. Test apparatus 190 also supplies power to the DUT 102 via conventional DUT power supply 195, which, for simplicity, is not shown in FIG. 4. It is understood that DUT 102 has a plurality of signal and power pins 115 connected via its package 110 to test apparatus 190. Although not illustrated, it is further understood that in the present system test apparatus 190, and the elements of temperature control apparatus 100 as previously described, are configured and assembled to allow the DUT to fit within the overall constraints of a typical commercially available optical probing microscope such as the Schlumberger IDS™ 2500, without interfering with the primary objective of obtaining optical signals from the DUT.

As described here, and illustrated in FIG. 4, the DUT is in one embodiment conventionally probed optically with laser beam 210 generated by laser source 200. A suitable laser is a YAG 1064 mode-locked laser. For detail on the laser and the microscope, See U.S. patent application Ser. No. 09/500,757 filed Feb. 8, 2000, K. Wilsher, W. K. Lo, incorporated herein by reference in its entirety. Laser beam 210 is focused onto a location (e.g., one transistor) on the DUT through objective lens 230. After the DUT is probed by laser beam 210, the resultant photons reflected from a particular transistor of the DUT, pass back up through the lens 230 and are detected by the photon detector 240 and subsequently processed conventionally. Conventional reference arm 230 is for calibration purposes.

Thus, what has been described is an apparatus and method for optically probing or otherwise testing an active IC while controlling the temperature of the IC device under test. In the foregoing detailed description, the methods and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

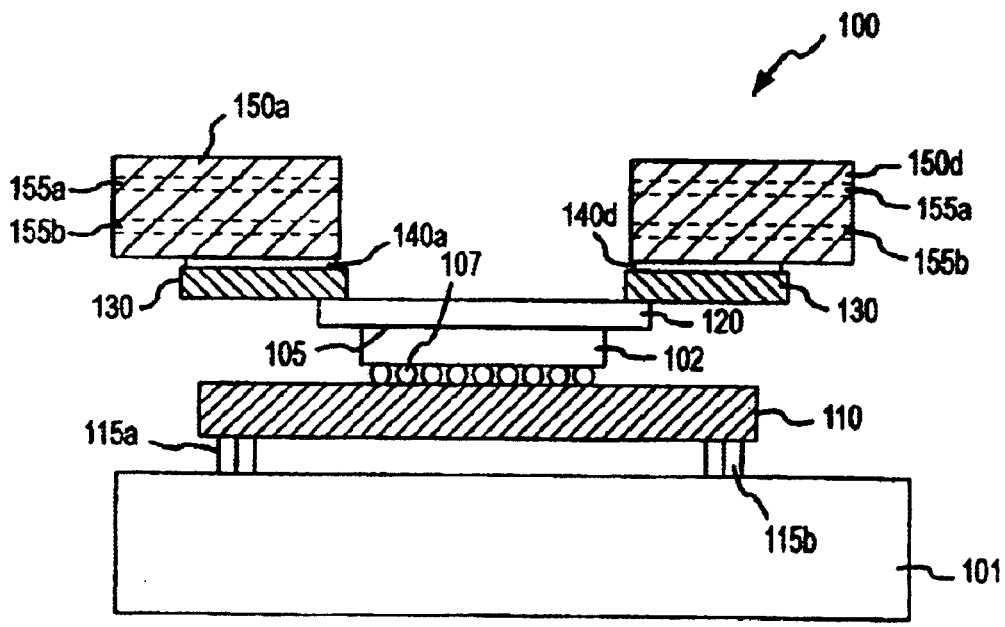

We claim:

1. An apparatus for use with an integrated circuit device under test under optical testing, comprising:

a support for the device under test providing a plurality of electrical contacts to a corresponding plurality of leads on the device under test; and an assembly for maintaining a temperature of the device under test, comprising:

a heat conducting structure including a central portion transmissive of light for passage of an optical beam directed onto or from the device under test and adapted to lie in thermal contact with a surface of the device under test; and a thermoelectric device in contact with the heat conducting structure, thereby to heat and cool the heat conducting structure.

2. The apparatus of claim 1 wherein the central portion of the heat conducting structure comprises a diamond film.

3. The apparatus of claim 2 wherein the heat conducting structure comprises a metal structure circumferential to the diamond film.

4. The apparatus of claim 1 wherein the thermoelectric device is a Peltier device.

5. The apparatus of claim 1 further comprising a plurality of thermoelectric devices arranged to laterally surround the device under test.

6. The apparatus of claim 1 further comprising a temperature sensor in thermal proximity to the device under test.

7. The apparatus of claim 6 further comprising a control coupled to the temperature sensor and the thermoelectric device.

8. The apparatus of claim 1 further comprising a control coupled to the thermoelectric device and sensing power drawn by the device under test.

9. The apparatus of claim 1 further comprising an optical probing microscope arranged to direct an optical probing beam onto the device under test through the central portion of the heat conducting structure.

10. The apparatus of claim 1, wherein the heat conducting structure includes a first portion in direct contact with the central portion and a second portion overlying the thermoelectric device.

11. The apparatus of claim 10, comprising a plurality of thermoelectric devices each in contact with the heat conducting structure, each thermoelectric device having an associated overlying portion of the heat conducting structure.

12. The apparatus of claim 1, the heat conducting structure defining at least one coolant channel.

13. A method of optically testing a die of an integrated circuit, comprising the acts of:

operating the integrated circuit;

thermoelectrically heating and cooling the integrated circuit in response to fluctuations in its heat exhaustion to maintain it at a predetermined temperature; and sensing photons from the integrated circuit.

14. The method of claim 13 further comprising the act of first exposing a surface of the die of the integrated circuit.

15. The method of claim 14 further comprising the act of sensing the temperature of the integrated circuit die and in response controlling the heating and cooling.

* * * * *

UNITED STATES PATENT AND TRADEMARK OFFICE
CERTIFICATE OF CORRECTION

PATENT NO.   : 6,836,014 B2
DATED        : December 28, 2004
INVENTOR(S)  : Hunt et al.

It is certified that error appears in the above-identified patent and that said Letters Patent is hereby corrected as shown below:

The title page, showing an illustrative figure, should be deleted and substitute therefore the attached title page.

Delete drawing sheets 1 through 4 and replace with formal drawing sheets 1 through 4 attached.

Signed and Sealed this

Thirtieth Day of August, 2005

JON W. DUDAS
*Director of the United States Patent and Trademark Office*

(12) United States Patent
Hunt et al.

(10) Patent No.: US 6,836,014 B2
(45) Date of Patent: Dec. 28, 2004

(54) OPTICAL TESTING OF INTEGRATED CIRCUITS WITH TEMPERATURE CONTROL

(75) Inventors: Dean M. Hunt, Danville, CA (US); Don Haga, Redwood City, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/264,716

(22) Filed: Oct. 3, 2002

(65) Prior Publication Data
US 2004/0065880 A1 Apr. 8, 2004
(Under 37 CFR 1.47)

(51) Int. Cl.[7] .......................... H01L 23/06; H05K 7/20
(52) U.S. Cl. .................. 257/706; 257/705; 257/707; 257/712; 257/717; 361/704; 361/705; 361/706
(58) Field of Search .......................... 257/705–707, 257/712, 717–720; 361/676, 709, 704–705

(56) References Cited

U.S. PATENT DOCUMENTS

| | | | |
|---|---|---|---|
| 5,872,360 A | | 2/1999 | Paniccia et al. .......... 250/341.4 |
| 5,895,972 A | * | 4/1999 | Paniccia ..................... 257/706 |
| 5,923,086 A | | 7/1999 | Winer et al. ................ 257/713 |
| 6,424,533 B1 | * | 7/2002 | Chu et al. ................... 361/719 |
| 6,476,627 B1 | * | 11/2002 | Pelissier et al. ............. 324/760 |

* cited by examiner

Primary Examiner—Donghee Kang
(74) Attorney, Agent, or Firm—Dorsey & Whitney LLP

(57) ABSTRACT

Method and apparatus for optically testing (e.g., using a laser beam) an operating integrated circuit (device under test—DUT) that actively control the operating temperature of the DUT. This is chiefly useful with flip-chip packaged ICs. The temperature of the DUT varies with its operating power consumption, and this fluctuation in temperature adversely affects the results obtained during optical probing or other optical testing. Furthermore, the DUT may be damaged if its temperature exceeds design limits. The temperature of the DUT is controlled by thermally contacting the exposed backside surface of the DUT die to a diamond film heat conductor, an associated heat sink structure, and at least one thermoelectric device. The thermoelectric device is controlled by a temperature sensor proximal to the DUT. By controlling the amount and direction of the electrical current supplied to the thermoelectric device in response to the sensed temperature, the temperature of the DUT is maintained.

15 Claims, 4 Drawing Sheets